(12) United States Patent
Omi et al.

(10) Patent No.: US 6,916,709 B2
(45) Date of Patent: Jul. 12, 2005

(54) NON-VOLATILE SEMICONDUCTOR MEMORY DEVICE AND MANUFACTURING METHOD FOR THE SAME

(75) Inventors: Tadahiro Omi, Sendai (JP); Naoki Ueda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 24 days.

(21) Appl. No.: 10/732,444

(22) Filed: Dec. 11, 2003

(65) Prior Publication Data

US 2004/0121539 A1 Jun. 24, 2004

(30) Foreign Application Priority Data

Dec. 12, 2002 (JP) .......................... 2002-360881

(51) Int. Cl.⁷ .............................................. H01L 21/336
(52) U.S. Cl. ...................... 438/257; 438/591; 257/325
(58) Field of Search ................................. 438/257, 261, 438/555, 558, 591, 605, 680; 257/320, 324, 325, 326, 639

(56) References Cited

U.S. PATENT DOCUMENTS 5,238,863 A  *  8/1993  Fukusho et al. ............ 438/591
5,780,115 A  *  7/1998  Park et al. .................... 427/539

FOREIGN PATENT DOCUMENTS

JP          2001-160555          6/2001

* cited by examiner

*Primary Examiner*—Phuc T. Dang
(74) *Attorney, Agent, or Firm*—Nixon & Vanderhye, P.C.

(57) ABSTRACT

A non-volatile semiconductor memory device comprising: a first insulating film provided on a silicon based substrate; a first electrode provided on the first insulating film as a floating gate; a second insulating film provided on the first electrode; and a second electrode formed as a control gate on the first electrode through the second insulating film, wherein the first insulating film is formed of at least two layers of: a lower silicon nitride film obtained by nitriding the silicon based substrate; and an upper silicon nitride film or upper silicon oxide film formed on the lower silicon nitride film according to a chemical vapor deposition method, and the lower silicon nitride film contains rare gas elements at an area density of $10^{10}$ cm$^{-2}$ or more in at least a part of the lower silicon nitride film.

9 Claims, 6 Drawing Sheets

NON-VOLATILE SEMICONDUCTOR MEMORY DEVICE AND MANUFACTURING METHOD FOR THE SAME

CROSS-REFERENCE TO RELATED APPLICATION

This application is related to Japanese application No. 2002-360881 filed on Dec. 12, 2002, whose priority is claimed under 35 USC §119, the disclosure of which is incorporated by reference in its entirety.

BACKGROUND OF THE INVENTION

1. Field of the Invention

The present invention relates to a non-volatile semiconductor memory device and a manufacturing method for the same. More specifically, the present invention relates to a non-volatile semiconductor memory device in which data can be electrically rewritten, and a manufacturing method for the same.

2. Description of the Related Art

A flash memory that represents a non-volatile semiconductor memory device in which data can be electrically rewritten will be described below. A flash memory has: a first insulating film 2; a first polysilicon electrode 3 that becomes a floating gate; a second insulating layer 4 formed of a lamination made of an oxide film, a nitride film and another oxide film; and a second polysilicon electrode 5 that becomes a control gate which are laminated on a semiconductor substrate 1 in this order shown in FIG. 4.

Figure 4:
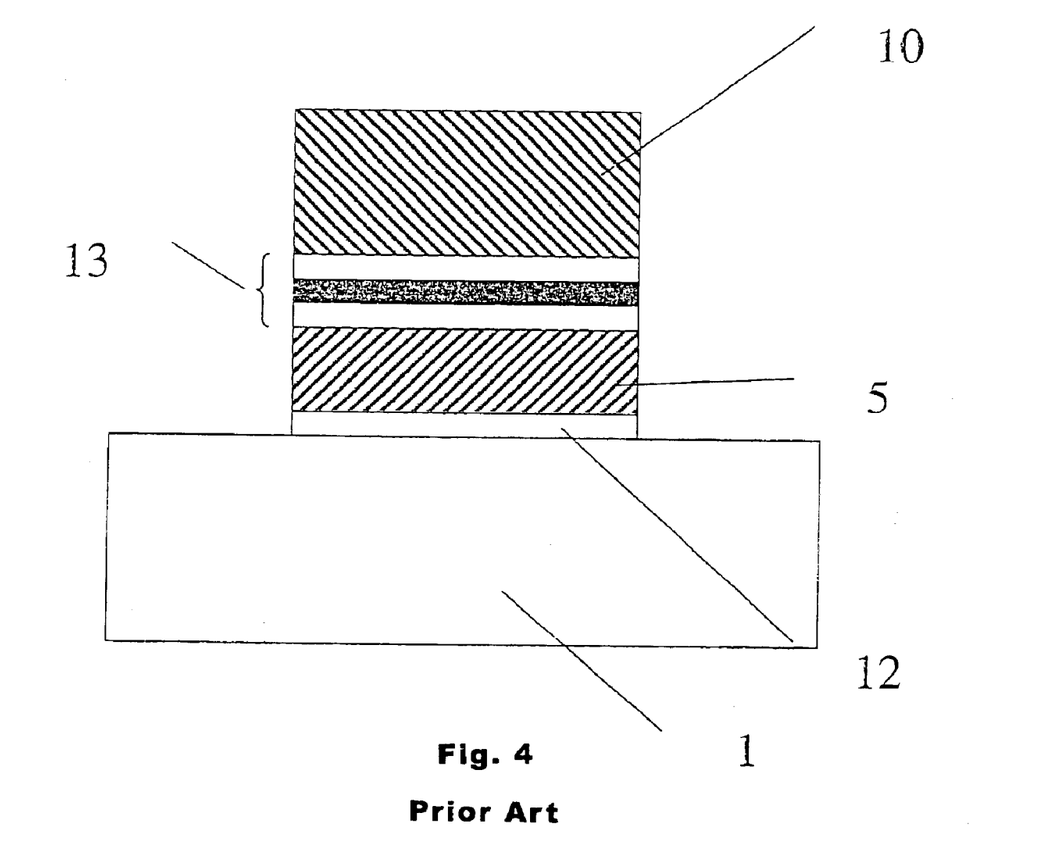
FIG. 4 is schematic cross-sectional view of a flash memory cell of the prior art.
Figure 5:
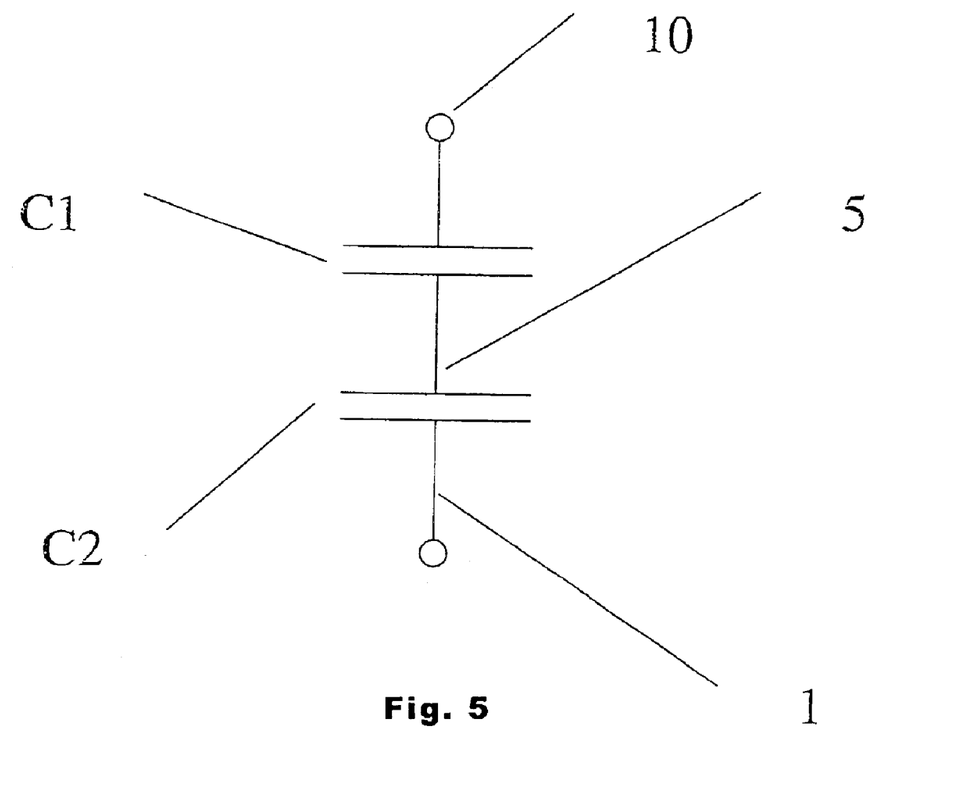
FIG. 5 is a simplified equivalent circuit diagram of a non-volatile semiconductor memory device having a floating gate.

It is noted that a source and a drain are formed in the surface layer of the silicon substrate 1 that correspond to the both ends of the floating gate although the source and the drain are not shown in FIG. 4. In addition, FIG. 5 shows an equivalent circuit diagram of the flash memory of FIG. 4.

This flash memory allows for rewriting of data through release and injection of electrons via the first insulating film 2 by utilizing the tunnel phenomenon; therefore, the first insulating film 2 is also referred to as a tunnel insulating film. The first insulating film 2 usually has a film thickness of approximately 8 to 20 nm.

The writing operation is carried out by applying a voltage of 4 to 6 V to the drain and by applying a voltage of 10 to 12 V to the control gate for 1 $\mu$sec to 5 msec. Electrons within the channel in the semiconductor substrate are accelerated by the electrical field between the drain and the source under the above described conditions so as to become hot electrons which jump over the forbidden band in the first insulating film 12 and are injected into the floating gate 5. As a result, the floating gate 5 is negatively charged and the threshold voltage of the control gate 10 becomes of a high value between 3.5V and 5.5V. The written program is carried out in such a manner.

On the other hand, the erasing operation is carried out by applying a voltage of −6 to −8V to the control gate, by applying a voltage of 4 to 6V to the source and by setting the drain in the floating condition. A tunneling phenomenon occurs under such conditions through the first insulating film 12 in the portion where the source and the floating gate 5 overlap with each other. Therefore, electrons within the floating gate are extracted to the source region, so that the erasing operation is carried out and the threshold voltage becomes of a low value between 1 V and 3 V.

In addition, Japanese Unexamined Patent Publication No. 2001-160555 discloses a non-volatile semiconductor memory device having the same structure as described above, wherein the first insulating film 12 is formed solely of a silicon nitride film made of radical nitriding species.

The writing speed according to the above-described hot electron injection system is determined by the gate current Ig of the electrons which are injected into the floating gate according to this system. The Ig is specified by the following expression according to an electron temperature model.

$$Ig = C(Eox) \cdot Id \cdot \exp(-q\phi b/kTe) \quad \text{expression (1)}$$

Herein, C(Eox) is a function which is proportional to the injection probability and which depends on electrical field Eox applied to the gate insulating film between the drain and the gate. Id denotes a drain current, $\phi$b denotes the height of the barrier of the gate insulating film, k is the Boltzmann's constant, and Te is the electron temperature.

As described above, the writing speed is determined by the injection probability C(Eox) of the hot electrons, the drain current Id and the height $\phi$b of the barrier of the gate insulating film. In addition, the injection probability C(Eox) is substantially determined by the structure of a cell of the flash memory because the reliability of the gate insulating film is regulated by electrical field Eox at the time of the writing.

The drain current Id at the time of the writing is represented as follows.

$$Id = \frac{W}{L} \cdot \mu n \cdot Cox \left[ (Vcg - Vth) \cdot Vd - \frac{1}{2}Vd^2 \right] \quad \text{expression (2)}$$

The drain current is also substantially determined by the structure of the cell as long as a thermally oxidized silicon film is used for the gate insulating film. That is, a channel length L in the W/L term is regulated by the limitation of miniaturization by the processing technology. The expansion of the cell size becomes necessary in order to increase a channel width W which is against the intention such as miniaturization and cost reduction generally when flash memory are manufactured. Mobility $\mu$n does not greatly change as long as a silicon oxide film is formed on the silicon substrate by means of thermal oxidization as the gate insulating film and, in addition, the height of the barrier of the gate insulating film is constant as long as the silicon oxide film is used.

Thus, it has been difficult to simultaneously implement miniaturization of cells and an increase in the writing speed in the case where a flash memory that is written according to a hot electron injection system is formed.

In addition, the tighter the bond of Si—N in the nitride film formed of radical nitriding species is, the higher the barrier property of the nitride film itself against nitriding species in the silicon nitride film formed of radical nitriding species described in Japanese Unexamined Patent Publication No. 2001-160555. Therefore, the diffusion of the nitriding species is blocked and the growth rate of this nitride film tends to be saturated, making it difficult to obtain an arbitrary thickness.

SUMMARY OF THE INVENTION

The present invention provides a non-volatile semiconductor memory device comprising: a first insulating film provided on a silicon based substrate; a first electrode provided on the first insulating film as a floating gate; a second insulating film provided on the first electrode; and a second electrode formed as a control gate on the first electrode through the second insulating film, wherein the first insulating film is formed of at least two layers of: a lower silicon nitride film obtained by nitriding the silicon based substrate; and an upper silicon nitride film or upper silicon oxide film formed on the lower silicon nitride film according to a chemical vapor deposition method, and the lower silicon nitride film contains rare gas elements at an area density of $10^{10}$ cm$^{-2}$ or more in at least a part of the lower silicon nitride film.

The present invention also provides a manufacturing method for a non-volatile semiconductor memory device comprising: a first insulating film provided on a silicon based substrate; a first electrode provided on the first insulating film as a floating gate; a second insulating film provided on the first electrode; and a second electrode formed as a control gate on the first electrode through the second insulating film, wherein the first insulating film is formed of at least two layers of: a lower silicon nitride film that contains rare gas elements at an area density of $10^{10}$ cm$^{-2}$ or more in at least a part of the lower silicon nitride film, and an upper silicon nitride film or upper silicon oxide film; the lower silicon nitride film is formed by nitriding the silicon based substrate in an atmosphere that includes nitrogen gas or a nitrogen atom-containing compound gas and a rare gas into which microwaves are introduced; and the upper silicon nitride film or upper silicon oxide film is formed according to a chemical vapor deposition method.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

A non-volatile semiconductor memory device of the present invention comprises: a first insulating film provided on a silicon based substrate; a first electrode provided on the first insulating film as a floating gate; a second insulating film provided on the first electrode; and a second electrode formed as a control gate on the first electrode through the second insulating film.

Although the silicon based substrate is not particularly limited, and examples thereof include a silicon substrate, a silicon germanium substrate and the like. The silicon based substrate may have a trench into which the floating gate is filled.

According to the present invention, the first insulating film between the silicon based substrate and the floating gate is formed of at least two layers of: a lower silicon nitride film obtained by nitriding the silicon based substrate; and an upper silicon nitride film or upper silicon oxide film formed on the lower silicon nitride film according to a chemical vapor deposition method.

Furthermore, at least a part of the lower silicon nitride film contains a rare gas element at an area density of $10^{10}$ cm$^{-2}$ or more. In addition, the rare gas element may be included in at least a part of the lower silicon nitride film or may be included in the entire surface of the lower silicon nitride film. Herein, it is preferable for the rare gas element to be Kr or Ar from the point of view of the efficiency of generating radicals that contribute to oxynitridation. In the case where the area density of rare gas element is less than $10^{10}$ cm$^{-2}$, the stoichiometric composition of the silicon nitride film is far away from the ideal, so that the generation rate of the silicon nitride film is greatly reduced and this is not preferable because a desired performance cannot be exercised. Preferable area density is $10^{10}$ cm$^{-2}$ or more. It is noted that the area density is measured by a secondary ion mass spectrometer (SIMS) and can be set at a predetermined value by adjusting manufacturing conditions such as a flow amount of the rare gas, DC bias, RF power and degree of vacuum.

An example of the method for forming a lower silicon nitride film that includes a rare gas element includes a method for nitriding silicon atoms included in the first electrode in an atmosphere that includes nitrogen gas or a nitrogen atom-containing compound gas and a rare gas. In particular, it is preferable to carry out nitridation while exciting plasma in the atmospheric gas by means of microwaves.

The method for exciting plasma by means of microwaves is not particularly limited as long as microwaves can be introduced into the process chamber, and a conventional method can be utilized. For example, a plasma unit using a radial line slot antenna can be utilized.

Herein, an example of the nitrogen atom-containing compound gas includes $NH_3$. In addition, $H_2$ may be included in the atmosphere.

It is preferable for the flow ratio of the respective gases in the atmosphere to be 90 to 99.9%/0.1 to 10% (Kr/$NH_3$) in the case where the rare gas is Kr and the nitrogen atom-containing compound gas is $NH_3$.

It is preferable for the frequency of the microwaves which are used to be in a range between 900 MHz or more and 10 GHz or less.

In particular, it is preferable to form the lower silicon nitride film by using a high density plasma excited by microwaves when the temperature of the substrate is as low as 550° C. or less (e.g., 200 to 550° C.). That is, a thin silicon nitride film having leak current-proof characteristics equal to or superior to those of the silicon oxide film formed on a single crystal Si having the plane direction of (100) at a high temperature of approximately 1000° C. and having charge-to-breakdown characteristics superior to those of the silicon oxide film formed on a single crystal Si having the plane direction of (100) at a high temperature of approximately 1000° C. can be formed on the silicon based substrate at a temperature as low as 550° C. or less (e.g., 400 to 500° C.) by directly nitriding silicon with hydrogen nitride NH* in atom form (also referred to as NH radical), nitrogen N* in atom form (also referred to as N radical) or a mixed nitriding species of $N_2^+$ radicals and hydrogen H* in atom form (also referred to as H radical). A high quality silicon nitride film is formed on the silicon based substrate according to this method, so that the roughness of the surface of the silicon based substrate in the interface between the silicon based substrate and the silicon nitride film can be greatly improved as described above and the electron mobility in the surface of the silicon based substrate can be greatly increased.

The drain current Id in the above expression (2) can be greatly increased according to the above-described increase in the electron mobility and, as a result, the gate current Ig generated by the channel hot electron in the above expression (1) can be improved.

In addition, the gate insulating film between the silicon based substrate and the floating gate is changed from the silicon oxide film to a silicon nitride film, so that the height φb of the barrier of the gate insulating film against electrons can be lowered. Accordingly, the injection probability of the channel hot electron into the floating gate in the above expression (1) can be increased. As a result, the gate current Ig can be improved.

It is also possible to change the nitrogen concentration peak in the insulating film in the depth direction by changing the flow ratio of the nitrogen gas or the nitrogen atom-containing compound gas during the formation of the insulating film.

Furthermore, it is preferable for the lower silicon nitride film to be exposed to hydrogen nitride NH* in atom form or nitrogen N* in atom form and hydrogen H* in atom form that have been formed by exciting plasma by means of microwaves in an atmosphere that includes nitrogen gas or a nitrogen atom-containing compound gas and a rare gas after the formation of the lower silicon nitride film. As a result, it becomes possible to form a high quality silicon nitride film at a low temperature.

In addition, the lower silicon nitrate film may be exposed to the atmosphere that includes hydrogen gas.

In addition, after the formation of the lower silicon oxide film it is preferable for the lower silicon oxide film to be exposed to oxygen O* in atom form that has been generated by exciting plasma by means of microwaves in an atmosphere that includes oxygen gas or an oxygen atom-containing compound gas and a rare gas. As a result, hydrogen that has been separated from the interface between the silicon nitride film and the silicon substrate can be compensated in an annealing process in the subsequent step wherein hydrogen radicals or hydrogen molecules are used, thereby deterioration of the characteristics of the silicon nitride film due to the high temperature process can be prevented. In addition, the lower silicon oxide film may be exposed to an atmosphere that includes oxygen gas.

The same gas as that utilized for the formation of the above-described lower silicon nitride film or lower silicon oxide film can be utilized as the atmospheric gas in the above process. It is preferable for the frequency of the utilized microwaves to be in a range between 900 MHz or more and 10 GHz or less. Furthermore, it is preferable to carry out the above-described process by setting the temperature of the substrate as low as 550° C. or less (e.g., 200 to 550° C.).

Next, the floating gate is formed on the first insulating film. The floating gate is not particularly limited, and examples thereof include metal layers such as those of aluminum and copper, a polysilicon layer, silicide layers of high melting point metals (titanium, tungsten and the like), and laminations thereof. A nitride film which functions as a charge holding layer and which makes electrons accumulate in an electron trap may be used in addition to the floating gate made of any of the above-described conductive layers.

In the case where a trench is formed in the silicon based substrate, the floating gate may be formed in accordance with a method of forming a first insulating film on the surface of the trench; filling the floating gate material into the trench; and flattening the layer made of the electrode material by means of a chemical mechanical polishing method.

A second insulating film is formed on the floating gate. Examples of the second insulating film include a silicon oxide film, a silicon nitride film, a lamination thereof, and the like.

Next, a second electrode is formed as the control gate on the floating gate through the second insulating film. The control gate is not particularly limited, and examples thereof include metal layers such as those of aluminum and copper, a polysilicon layer, silicide layers of high melting point metals (titanium, tungsten and the like), and laminations thereof.

In addition, in the case where the non-volatile semiconductor memory device has a final passivation layer as the top layer, it is preferable to expose the lower and upper silicon nitride films of the upper silicon oxide film to a hydrogen radical atmosphere at a temperature of 500° C. or less (concretely, 300 to 450° C.) before the formation of the final preservation layer. This treatment can make the composition and the electrical characteristics of the upper silicon nitride film or upper silicon oxide film that has been formed through a chemical vapor reaction close to those of an ideal silicon nitride film or an ideal silicon oxide film. In addition, this treatment can prevent the deterioration of the characteristics of the silicon nitride film or the silicon oxide film due to a high temperature treatment by compensating hydrogen that has been separated from the lower and upper silicon nitride film or upper silicon oxide film and from the interface between the lower silicon nitride film and the silicon substrate.

As described above, the first insulating film has a two layered structure obtained by directly nitriding the silicon based substrate made of polysilicon with species (NH or N radicals) containing nitrogen in atom form and by forming a silicon nitride film or a silicon oxide film through a chemical vapor reaction, thereby it becomes possible to implement a broad range of film thickness that can be applied and to achieve excellent interface characteristics and a short processing time for the formation of the film.

Embodiment 1

Figure 1:
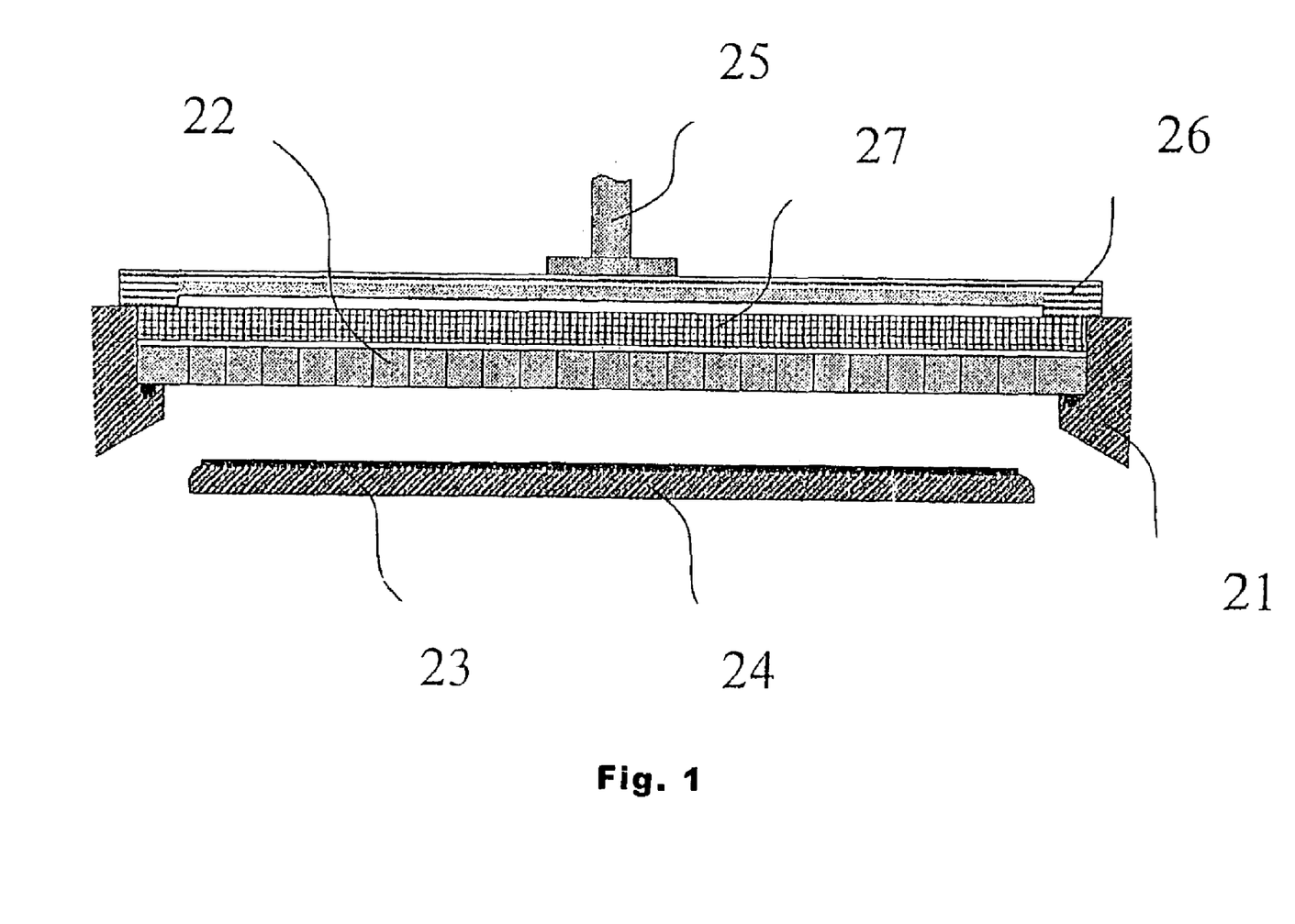
FIG. 1 is a schematic view of a plasma unit using a radial line slot antenna.

First, formation of a lower silicon nitride film using plasma at a low temperature will be described. FIG. 1 is a schematic cross sectional view showing one example of a unit using a radial line slot antenna in order to implement a nitriding method of the present invention.

In the present embodiment, Kr is utilized as a rare gas for the formation of a nitride film. A vacuum container (process chamber) 21 is vacuumed and Kr gas and $NH_3$ gas are introduced from a shower plate 22 into the process chamber within which pressure is set at approximately 1 Torr. A substrate 23 in a disk form such as a silicon wafer is placed on a sample support 24 which has a heating mechanism, and the temperature of the sample is set at approximately 400° C.

2.45 GHz microwaves are transmitted into the process chamber 21 from a coaxial waveguide 25 through a radial line slot antenna 26 and a dielectric plate 27, so that high density plasma is generated in the process chamber 21. The distance between the shower plate 22 and the substrate 23 is set at 60 mm in the present embodiment. The smaller this distance is, the higher the speed of the film formation becomes possible. The silicon nitride film formed under the above-described conditions includes Kr at an area density of $10^{10}$ cm$^{-2}$ or more.

As described above, the inclusion of Kr at an area density of $10^{10}$ cm$^{-2}$ or more contributes to the improvement of electrical characteristics and the reliability of silicon nitride film. Concretely, the silicon nitride film is considered to be improved because of the following reasons.

First, NH radicals are efficiently generated due to Kr radicals in the intermediate excited condition in the high density plasma excited in a mixed gas of Kr and NH$_3$. Such NH radicals nitride the surface of the substrate. It becomes possible according to the present embodiment to form a high quality silicon nitride film on any of the surfaces in a (100) plane, in a (111) plane and in a (110) plane at a low temperature irrelevant of the plane direction of silicon.

Existence of hydrogen radicals in the plasma is one important factor for the formation of a silicon nitride film according to the present invention. The existence of hydrogen radicals in the plasma allows dangling bonds on the silicon nitride film and in the interface to be terminated by forming Si—H and N—H bonds and, as a result, electron traps on the silicon nitride film and in the interface are eliminated. The existence of the Si—H bond and N—H bond in the silicon nitride film of the present invention is confirmed through the measurement of infrared absorption spectrum and X-ray photoelectron spectrum, respectively. The existence of hydrogen eliminates the hysteresis in the CV characteristics. In addition, the density in the interface between the silicon film and the silicon nitride film can be maintained at a level as low as $3 \times 10^{10}$ cm$^{-1}$ in the case where the temperature of the substrate is 500° C. or more.

Figure 6:
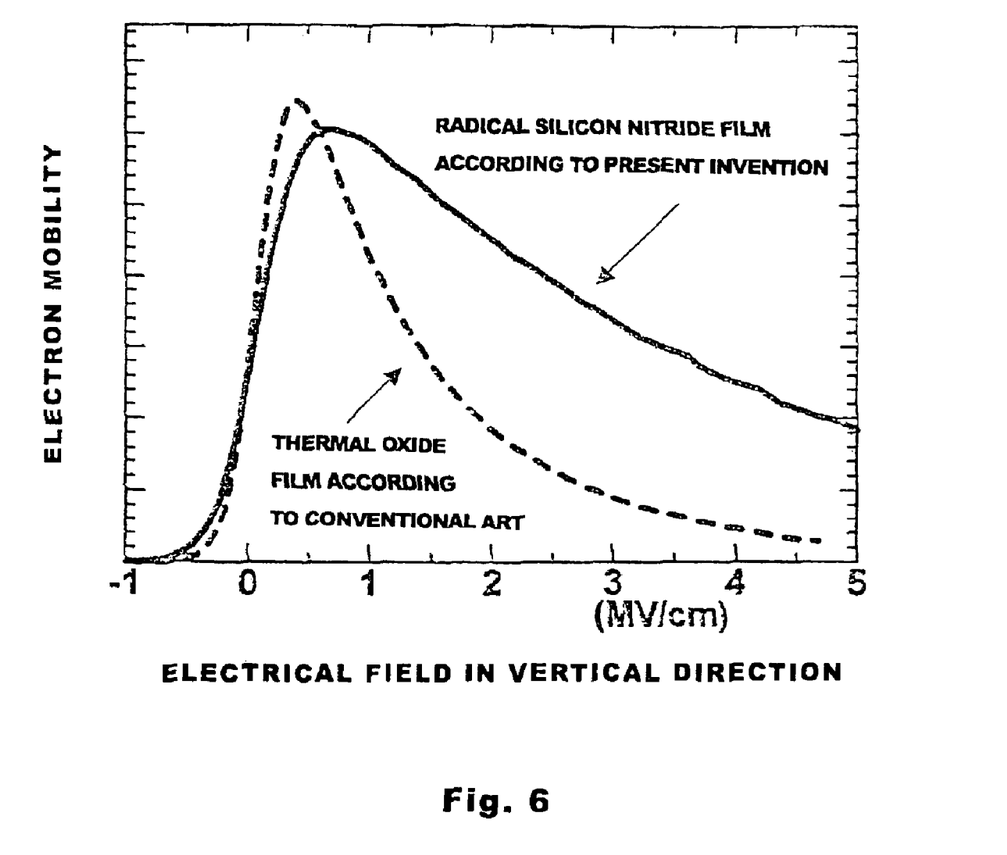
FIG. 6 is a view showing the relation between an electron mobility and an electrical field in vertical direction of a non-volatile semiconductor memory devices of the present invention and the prior art.

In addition, roughness in the interface between the silicon substrate and the silicon nitride film is drastically improved on the surface of the silicon substrate where the silicon nitride film is formed according to the above-described technique. FIG. 6 shows the result of comparing the electron mobility in the channel surface of a MOSFET having a silicon nitride film that has been formed according to the above-described technique as the gate insulating film with that of a MOSFET that has been formed through thermal oxidation in a conventional high temperature oxidation atmosphere.

It can be seen from FIG. 6 that mobility is greatly increased particularly on the high electrical field side where scattering becomes significant in the channel surface in the case where the gate insulating film is made of a silicon nitride film according to the above-described technique. Thus, according to the method of the present invention, the interface between the silicon nitride film and the silicon substrate becomes very flat; therefore, it becomes difficult for the interface to be subjected to scattering due to roughness of the channel surface. As a result, the mobility $\mu$n in the above expression (2) increases due to electrons having a high mobility. Accordingly, hot electron injection of a high efficiency becomes possible, so that the gate current Ig made of high hot electrons can be obtained. As a result, a writing operation of a high speed becomes possible.

In addition, it becomes possible to reduce the voltage between the drain and the source while maintaining the gate current, that is, the writing speed. Thereby, a reduction in the voltage for the writing operation can be achieved. Reduction in the voltage between the drain and the source at the time of writing allows reduction in the width for separation between bit lines or between drains and sources of the adjacent cells in a NOR-type memory. As a result, miniaturization of the cells and an increase in the bit capacity can be achieved.

In the case where a silicon nitride film is formed by utilizing a mixture gas of Kr and N$_2$/H$_2$, the traps for electrons and positive holes in the film can be drastically reduced by setting the partial pressure of the hydrogen gas at 0.5% or more. This effect can be achieved as a result of formation of Si—H bond and N—H bond in the insulating film and inclusion of Kr. In addition, stress is relieved in the nitride film and in the interface between the silicon film and the nitride film, and fixed charge and the interface level density in the silicon nitride film are reduced, so that the electrical characteristics and the reliability are greatly improved.

Embodiment 2

A first embodiment wherein the present invention is used in a flash memory will be described with reference to FIGS. 2A to 2F.

Figure 2A:
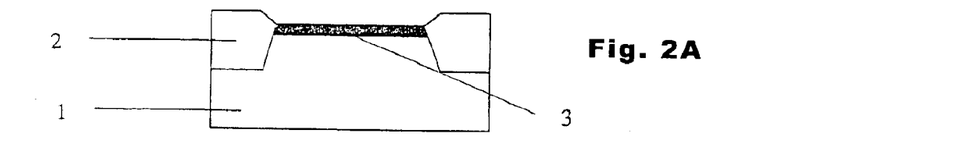
FIGS. 2A to 2F are schematic cross-sectional views showing steps for manufacturing the flash memory cell of the first and second embodiment semiconductor devices of the present invention.

First, a well and an element isolation region 2 are formed on a silicon substrate 1 and a lower silicon nitride film 3 that becomes a tunnel insulating film of a flash memory is formed after the removal of the insulating film on an active region (FIG. 2A). This lower silicon nitride film 3 is formed as follows.

The vacuum container (process chamber) is vacuumed, and Kr gas, N$_2$ gas and H$_2$ gas are introduced from the shower plate into the process chamber wherein the pressure is set at approximately 100 mTorr and the temperature of the silicon substrate is set at 500° C. Then, 2.45 GHz microwaves are transmitted into the process chamber through a radial line slot antenna and a dielectric plate from a coaxial waveguide and a high density plasma is generated in the process chamber, thereby the lower silicon nitride film 3 is formed on the surface of the silicon substrate so as to have a thickness of 1 to 7 nm. This lower silicon nitride film 3 includes Kr at an area density of $10^{10}$ cm$^{-2}$ or more.

Figure 2B:
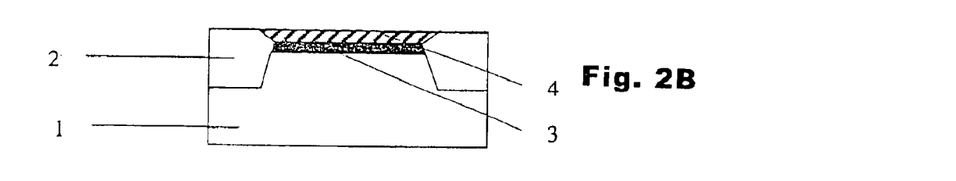

However, it is difficult to manufacture a silicon nitride film having a thickness greater than 7 nm because of the above-described denseness of the silicon nitride film according to this film manufacturing process itself. Next, an upper silicon nitride film 4 is formed on the lower silicon nitride film 3 in order to obtain a film thickness having sufficient insulating property for the flash memory (FIG. 2B). This is formed as follows.

The inside of the process chamber is set at a pressure as low as 1 Torr or less, and the silicon substrate is heated to 700 to 800° C. and then, SiClH$_2$ gas and NH$_3$ gas are introduced. These gasses make a reaction, so that the upper silicon nitride film 4 made of Si$_3$N$_4$ is deposited on the lower silicon nitride film 3 which is the first layer so as to have a thickness of approximately 5 to 20 nm. This is an example of a method for depositing the upper silicon nitride film by means of a chemical vapor reaction, and any reaction for depositing a silicon nitride film resulting from a reaction of a reduction gas of Si and a nitrogen based gas may of course be used for the present embodiment.

Figure 2C:
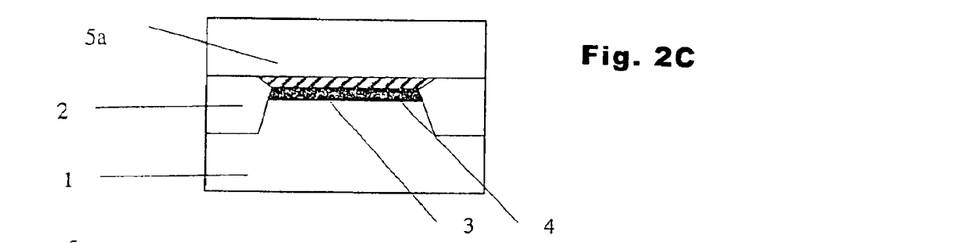

Furthermore, a polysilicon layer 5a is deposited as the first electrode that becomes a floating gate so as to have a thickness of approximately 100 nm (FIG. 2C).

Figure 2D:
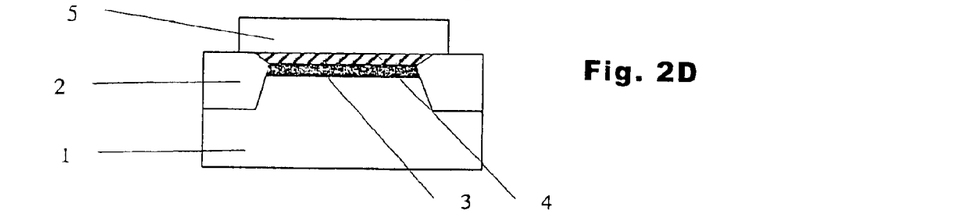

Next, the region for the floating gate is defined according to lithography and, in addition, the polysilicon layer 5a is etched by means of dry etching, so that a floating gate 5 is formed (FIG. 2D).

Figure 2E:
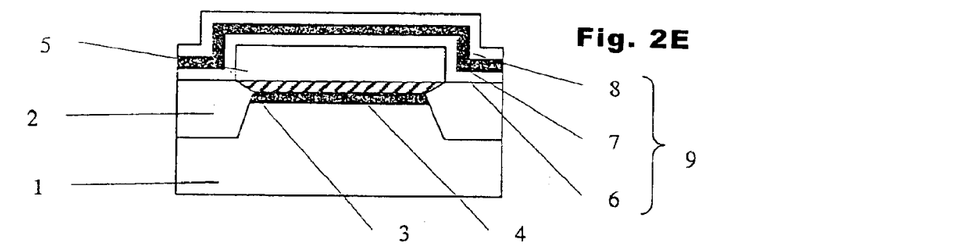

Then, a second insulating film 9 is formed of a complex insulating film made of three layers of a lower oxide film 6, a nitride film 7 and an upper oxide film 8 (FIG. 2E).

Figure 2F:
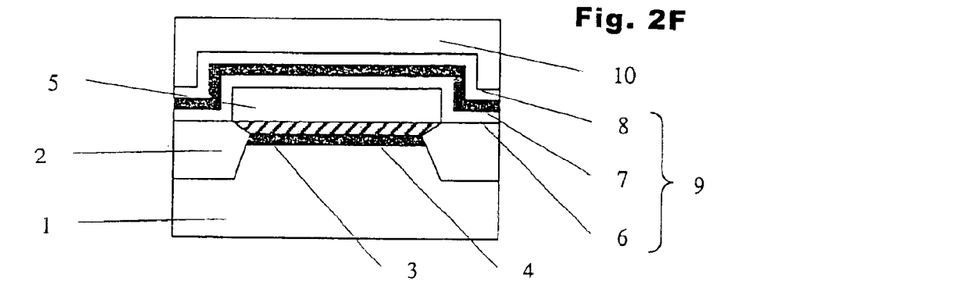

After that, a polysilicon layer is deposited so as to have a thickness of approximately 100 nm for the second electrode material which becomes the control gates of the non-volatile semiconductor memory device. Furthermore, regions of the control gates are defined by means of lithography and this electrode material is patterned by means of dry etching so as to obtain a control gate 10 (FIG. 2F). Such an electrode becomes a gate electrode of a MOSFET in the peripheral circuit region.

Furthermore, after the formation of source/drain region of the memory cells and of the peripheral circuit MOSFETs, although not shown in the cross sectional views, the first interlayer insulating film is formed, so that contact holes are formed by means of photolithography and anisotropic dry etching. After that, the silicon substrate is annealed in a hydrogen radical atmosphere at 300 to 500° C.

Furthermore, formation of wires and formation of an interlayer insulating film are repeated and the final passivation film is formed and, after that, openings for wire bonding pads are formed so as to complete the process.

Embodiment 3

Another embodiment of the present invention is shown in FIGS. 2A to 2F. First, a well and an element isolation region 2 are formed on a silicon substrate 1 and a lower silicon nitride film 3 that becomes a tunnel insulating film of a flash memory is formed after the removal of the insulating film on an active region (FIG. 2A). This lower silicon nitride film 3 is formed as follows.

The vacuum container (process chamber) is vacuumed, and Kr gas, $N_2$ gas and $H_2$ gas are introduced from the shower plate into the process chamber wherein the pressure is set at approximately 100 mTorr and the temperature of the silicon substrate is set at 500° C. Then, 2.45 GHz microwaves are transmitted into the process chamber through a radial line slot antenna and a dielectric plate from a coaxial waveguide and a high density plasma is generated in the process chamber, thereby the lower silicon nitride film 3 is formed on the surface of the silicon substrate so as to have a thickness of 1 to 7 nm. This lower silicon nitride film 3 includes Kr at an area density of $10^{10}$ cm$^{-2}$ or more.

However, it is difficult to manufacture a silicon nitride film having a thickness greater than 7 nm because of the above-described denseness of the silicon nitride film according to this film manufacturing process itself. Next, the upper silicon nitride film 4 is formed on the lower silicon nitride film 3 in order to obtain a film thickness having sufficient insulating property for the flash memory (FIG. 2B). This is formed as follows.

The inside of the process chamber is set at a pressure as low as 1 Torr or less, and the silicon substrate is heated to 700 to 900° C. and then, $SiClH_2$ gas and $NH_3$ gas are introduced. These gasses make a reaction, so that the upper silicon nitride film 4 made of $Si_3N_4$ is deposited on the lower silicon nitride film 3 which is the first layer so as to have a thickness of approximately 5 to 20 nm. This is an example of a method for depositing the upper silicon nitride film by means of a chemical vapor reaction, and any reaction for depositing a silicon nitride film resulting from a reaction of a reduction gas of Si and a nitrogen based gas may of course be used for the present embodiment. After that, the step of exposing the upper silicon nitride film 4 that has been deposited according to a CVD method to an atmosphere having $H_2$ or H* (radical) may be provided in order to improve the chemical composition and the electrical characteristics of the upper silicon nitride film 4.

Furthermore, a polysilicon layer 5a is deposited as the first electrode that becomes a floating gate so as to have a thickness of approximately 100 nm (FIG. 2C).

Next, the region for the floating gate is defined according to lithography and, in addition, the polysilicon layer 5a is etched by means of dry etching, so that a floating gate 5 is formed (FIG. 2D).

Next, the second insulating film 9 formed of a complex insulating film made of three layers of the lower oxide film 6, the nitride film 7 and the upper oxide film 8 (FIG. 2E).

After that, a polysilicon layer is deposited so as to have a thickness of approximately 100 nm for the second electrode material which becomes the control gates of the non-volatile semiconductor memory device. Furthermore, regions of the control gates are defined by means of lithography and the second electrode material is patterned by means of dry etching so as to obtain a control gate 10 (FIG. 2F). Such an electrode becomes a gate electrode of a MOSFET in the peripheral circuit region.

Furthermore, after the formation of source/drain region of the memory cells and of the peripheral circuit MOSFETs, although not shown in the cross sectional views, the first interlayer insulating film is formed, so that contact holes are formed by means of photolithography and anisotropic dry etching. After that, the silicon substrate is annealed in a hydrogen radical atmosphere at 300 to 500° C.

Furthermore, formation of wires and formation of an interlayer insulating film are repeated and the final passivation film is formed and, after that, openings for wire bonding pads are formed so as to complete the process.

Embodiment 4

Another embodiment of the present invention is shown in FIGS. 3A to 3F.

Figure 3A:
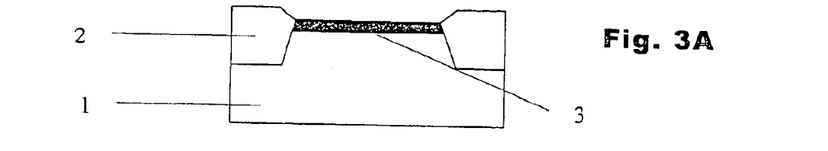
FIGS. 3A to 3F are schematic cross-sectional views showing steps for manufacturing the flash memory cell of a third embodiment semiconductor devices of the present invention.

First, a well and an element isolation region 2 are formed on a silicon substrate 1 and a lower silicon nitride film 3 that becomes a tunnel insulating film of a flash memory is formed after the removal of the insulating film on an active region (FIG. 3A). This lower silicon nitride film 3 is formed as follows.

The vacuum container (process chamber) is vacuumed, and Kr gas, $N_2$ gas and $H_2$ gas are introduced from the shower plate into the process chamber wherein the pressure is set at approximately 100 mTorr and the temperature of the silicon substrate is set at 500° C. Then, 2.45 GHz microwaves are transmitted into the process chamber through a radial line slot antenna and a dielectric plate from a coaxial waveguide and a high density plasma is generated in the process chamber, thereby the lower silicon nitride film 3 is formed on the surface of the silicon substrate so as to have a thickness of 1 to 7 nm. This lower silicon nitride film 3 includes Kr at an area density of $10^{10}$ cm$^{-2}$ or more.

Figure 3B:
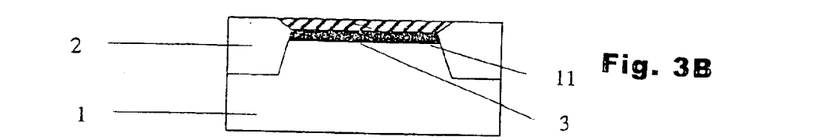

However, it is difficult to manufacture a silicon nitride film having a thickness greater than 7 nm because of the above-described denseness of the silicon nitride film according to this film manufacturing process itself. Next, the upper silicon oxide film 11 is formed on the lower silicon nitride film 3 in order to obtain a film thickness having sufficient insulating property for the flash memory (FIG. 3B). This is formed as follows.

The inside of the process chamber is set at a pressure as low as 1 Torr or less, and the silicon substrate is heated to 700 to 900° C. and then, $SiH_4$ gas and $N_2O$ gas are introduced. These gasses make a reaction, so that the upper silicon oxide film 11 is deposited on the lower silicon nitride film 3 so as to have a thickness of approximately 5 to 10 nm. This is an example of a method for depositing $SiO_2$ by means of a chemical vapor reaction, and any reaction for depositing $SiO_2$ resulting from a reaction of a reduction gas of Si and a oxygen based gas may of course be used for the present embodiment. After that, the step of exposing the upper silicon oxide film 11 that has been deposited according to a CVD method to an oxidation atmosphere having $O_2$ or O* (radical) may be provided in order to improve the chemical composition and the electrical characteristics of the upper silicon oxide film 11.

Figure 3C:
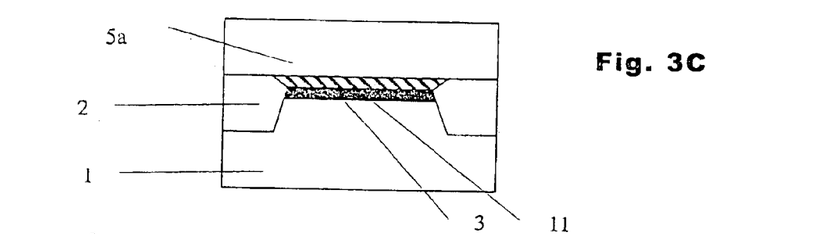

Furthermore, a polysilicon layer 5a is deposited as the first electrode that becomes a floating gate so as to have a thickness of approximately 100 nm (FIG. 3C).

Figure 3D:
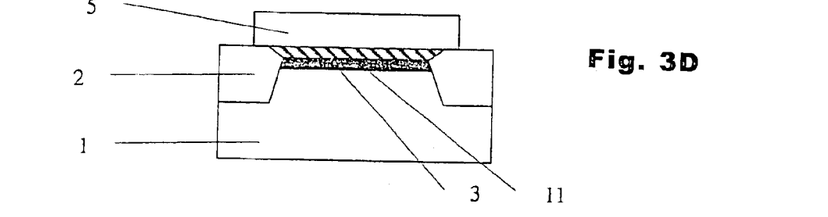

Next, the region for the floating gate is defined according to lithography and, in addition, the polysilicon layer 5a is etched by means of dry etching, so that a floating gate 5 is formed (FIG. 3D).

Figure 3E:
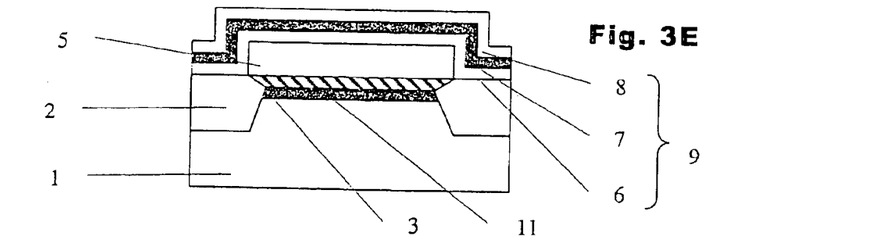

Next, the second insulating film 9 formed of a complex insulating film made of three layers of the lower oxide film 6, the nitride film 7 and the upper oxide film 8 (FIG. 3E).

Figure 3F:
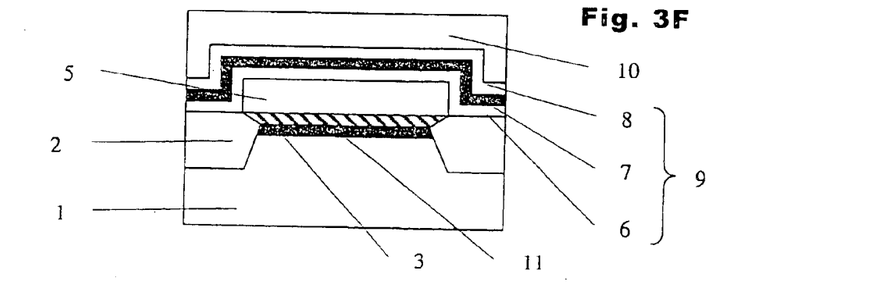

After that, a polysilicon layer is deposited so as to have a thickness of approximately 100 nm for the second electrode material which becomes the control gates of the non-volatile semiconductor memory device. Furthermore, regions of the control gates are defined by means of lithography and the second electrode material is patterned by means of dry etching so as to obtain a control gate 10 (FIG. 3F). Such an electrode becomes a gate electrode of a MOSFET in the peripheral circuit region.

Furthermore, after the formation of source/drain region of the memory cells and of the peripheral circuit MOSFETs, although not shown in the cross sectional views, the first interlayer insulating film is formed, so that contact holes are formed by means of photolithography and anisotropic dry etching. After that, the wafer is annealed in a hydrogen radical atmosphere at 300 to 500° C.

Furthermore, formation of wires and formation of an interlayer insulating film are repeated and the final passivation film is formed and, after that, openings for wire bonding pads are formed so as to complete the process.

The following can be found from Embodiments 2 to 4.

First, electron mobility can be increased in Embodiment 2; therefore, the drain current Id in the above expression (2) can be greatly increased. As a result, the gate current Ig made of channel hot electrons in the above expression (1) can be increased.

Furthermore, the insulating film on the silicon substrate side is made of a silicon nitride film, thereby the height $\phi b$ of the barrier for the electrons in the gate insulating film can be lowered. As a result, the injection probability of the channel hot electrons into the floating gate in the above expression (1) increases, so that the gate current Ig can be increased.

These two effects result in a great increase in the gate current due to the channel hot electron injection; therefore, the writing speed can be increased.

In addition, in Embodiment 3, the upper and lower silicon nitride films (first insulating film) are formed on the silicon substrate in the same manner as in Embodiment 2 and, after that, these nitride films are annealed in an atmosphere that includes hydrogen radicals, thereby the composition and the electrical characteristics of the silicon nitride films formed by means of chemical vapor reaction can be made closer to those of an ideal silicon nitride film. In addition, the hydrogen that has been separated from the silicon nitride film and from the interface between the nitride film and the silicon substrate in a high temperature atmosphere after the formation of the silicon nitride film is compensated for in the subsequent step of annealing treatment using hydrogen radicals or hydrogen molecules, thereby deterioration of the characteristics of silicon nitride film due to a high temperature treatment can be prevented.

Thus, a two-layer structure of a film obtained by directly nitriding a silicon substrate with nitriding species in atom form and a silicon nitride film according to a chemical vapor reaction is introduced, thereby it becomes possible to implement a broader range of film thickness, and to achieve excellent interface characteristics and a shorter processing time for the formation of the film.

Furthermore, in Embodiment 4, an upper silicon oxide film is additionally deposited according to a chemical vapor reaction on top of a lower silicon nitride film formed on a silicon substrate according to the same method as in Embodiment 2. After that, the silicon oxide film is annealed in an atmosphere that includes oxygen radicals or oxygen molecules, thereby the composition and the electrical characteristics of the silicon oxide film that has been formed according to a chemical vapor reaction can be made close to that of an ideal silicon oxide film. In addition, the hydrogen that is separated from the lower silicon nitride film and from the interface between the lower silicon nitride film and the silicon substrate in the high temperature atmosphere to which the lower silicon nitride film is exposed in the manufacturing step after the formation of the lower silicon nitride film is compensated for in the subsequent step of annealing treatment using hydrogen radicals or hydrogen molecules, thereby deterioration of the silicon nitride film due to a high temperature treatment can be prevented.

As described above, a two-layer structure of silicon oxide films: one obtained by direct nitridation of a silicon substrate by means of nitriding species in atom form; and the other obtained according to a chemical vapor reaction is introduced, thereby it becomes possible to implement a broader range of film thickness, and to achieve excellent interface characteristics between the silicon substrate and the silicon nitride film and a shorter processing time for the formation of the film. In addition, it becomes possible to implement a hot electron injection of high efficiency while maintaining the height of the barrier for the charge loss caused by leakage of charge (electrons) for information storage from the floating gate to the silicon substrate via the gate insulating film.

According to the present invention, the insulating film between the silicon based substrate and the first electrode (floating gate) is formed of at least two layers of: a lower silicon nitride film on the silicon based substrate side obtained by nitriding the silicon based substrate; and an upper silicon nitride film or upper silicon oxide film formed on the lower silicon nitride film according to a chemical vapor deposition method, and the lower silicon nitride film contains rare gas atoms at an area density of $10^{10}$ cm$^{-2}$ or more in at least a part of the lower silicon nitride film. It is therefore possible to obtain a high performance non-volatile semiconductor memory device wherein a high speed writing by hot electrons with a high efficiency is possible at a low voltage.

What is claimed is:

1. A non-volatile semiconductor memory device comprising: a first insulating film provided on a silicon based substrate; a first electrode provided on the first insulating film as a floating gate; a second insulating film provided on the first electrode; and a second electrode formed as a control gate on the first electrode through the second insulating film, wherein the first insulating film is formed of at least two layers of: a lower silicon nitride film obtained by nitriding the silicon based substrate; and an upper silicon nitride film or upper silicon oxide film formed on the lower silicon nitride film according to a chemical vapor deposition method, and the lower silicon nitride film contains rare gas elements at an area density of $10^{10}$ cm$^{-2}$ or more in at least a part of the lower silicon nitride film.

2. A device according to claim 1, in which the lower silicon nitride film is a film formed on the first electrode in an atmosphere that includes a nitrogen gas or a compound gas containing nitrogen atom and a rare gas and into which microwaves are introduced.

3. A device according to claim 1, in which the rare gas element is Kr or Ar.

4. A device according to claim 2, in which the compound gas containing nitrogen atom is $NH_3$.

5. A manufacturing method for a non-volatile semiconductor memory device comprising: a first insulating film provided on a silicon based substrate; a first electrode provided on the first insulating film as a floating gate; a second insulating film provided on the first electrode; and a second electrode formed as a control gate on the first electrode through the second insulating film, wherein the first insulating film is formed of at least two layers of: a lower silicon nitride film that contains rare gas elements at an area density of $10^{10}$ cm$^{-2}$ or more in at least a part of the lower silicon nitride film, and an upper silicon nitride film or upper silicon oxide film; the lower silicon nitride film is formed by nitriding the silicon based substrate in an atmosphere that includes nitrogen gas or a nitrogen atom-containing compound gas and a rare gas into which microwaves are introduced; and the upper silicon nitride film or upper silicon oxide film is formed according to a chemical vapor deposition method.

6. A method according to claim 5, in which the lower silicon nitride film is exposed to hydrogen nitride NH* in atom form or nitrogen N* in atom form and hydrogen H* in atom form that have been formed by exciting plasma by means of microwaves in the atmosphere that includes nitrogen gas or the nitrogen atom-containing compound gas and the rare gas.

7. A method according to claim 5, in which the non-volatile semiconductor memory device has a final passivation layer as a top layer, the lower silicon nitride film and the upper silicon nitride film or upper silicon oxide film are exposed under an atmosphere of hydrogen H* in atom form at a temperature of 500° C. or less before the final passivation layer is formed.

8. A method according to claim 5, in which the lower silicon nitride film and the upper silicon nitride film or upper silicon oxide film are formed in series.

9. A method according to claim 5, in which the upper oxide film is exposed to oxygen O* in atom form that have been formed by exciting plasma by means of microwaves in the atmosphere that includes oxygen gas or the oxygen atom-containing compound gas and the rare gas.

* * * * *

UNITED STATES PATENT AND TRADEMARK OFFICE
CERTIFICATE OF CORRECTION

PATENT NO. : 6,916,709 B2
DATED : July 12, 2005
INVENTOR(S) : Omi et al.

It is certified that error appears in the above-identified patent and that said Letters Patent is hereby corrected as shown below:

<u>Title page,</u>
Item [73], Assignee, should read:
-- Tadahrio OMI, Miyagi (JP)
   Sharp Kabushiki Kaisha, Osaka (JP) --.

Signed and Sealed this

Twentieth Day of December, 2005

JON W. DUDAS
*Director of the United States Patent and Trademark Office*